(12) United States Patent
Sakamoto

(10) Patent No.: US 10,403,350 B2
(45) Date of Patent: Sep. 3, 2019

(54) CONTROL UNIT HAVING RADIO INTERFERENCE AVOIDING FUNCTION

(71) Applicant: DENSO CORPORATION, Kariya, Aichi-pref. (JP)

(72) Inventor: Hiroshi Sakamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/727,841

(22) Filed: Oct. 9, 2017

(65) Prior Publication Data

US 2018/0158503 A1 Jun. 7, 2018

(30) Foreign Application Priority Data

Dec. 5, 2016 (JP) .................................. 2016-236154

(51) Int. Cl.
*G11C 11/406* (2006.01)

(52) U.S. Cl.
CPC ....... *G11C 11/406* (2013.01); *G11C 11/40611* (2013.01)

(58) Field of Classification Search
CPC .......................... G11C 11/406; G11C 11/40611
See application file for complete search history.

(56) References Cited

U.S. PATENT DOCUMENTS

2007/0005819 A1\* 1/2007 Skirvin ................. G06F 13/387
710/8
2011/0055455 A1\* 3/2011 Post ..................... G06F 12/0246
711/103
2013/0007357 A1\* 1/2013 Isaac .................. G11C 11/40615
711/106
2013/0080720 A1\* 3/2013 Nakamura ............ G06F 16/128
711/161

FOREIGN PATENT DOCUMENTS

| JP | H09-250262 A | 9/1997 |
| JP | 2007-085999 A | 4/2007 |
| JP | 2016-029768 A | 3/2016 |

\* cited by examiner

*Primary Examiner* — Larry T MacKall
(74) *Attorney, Agent, or Firm* — Posz Law Group, PLC

(57) ABSTRACT

A control unit includes a non-volatile memory and a CPU. The non-volatile memory stores activation interval information indicating an activation interval of mixed processing of transmission processing and non-transmission processing. The transmission processing executes a signal transmission through a bus and the non-transmission processing executes no signal transmission through the bus. The CPU determines an execution start time of the mixed processing based on the activation interval information stored in the non-volatile memory and executes the mixed processing from a determined execution start time. An interval of execution of the signal transmission processing executed in the mixed processing by changing the activation interval information stored in the non-volatile memory. It is thus possible to protect wireless communication from interference by changing the activation interval of the mixed processing so that a frequency determined in correspondence to the activation interval of the mixed processing does not match a frequency of a communication channel of the wireless communication.

4 Claims, 2 Drawing Sheets

FIG. 1
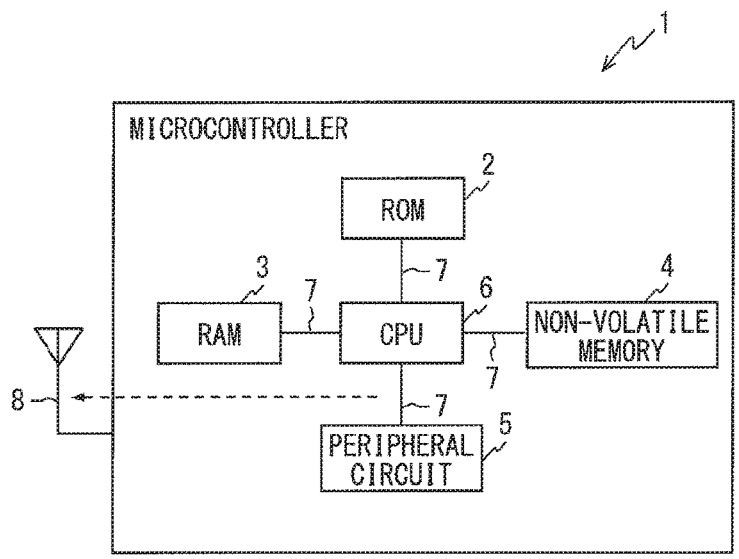
FIG. 2
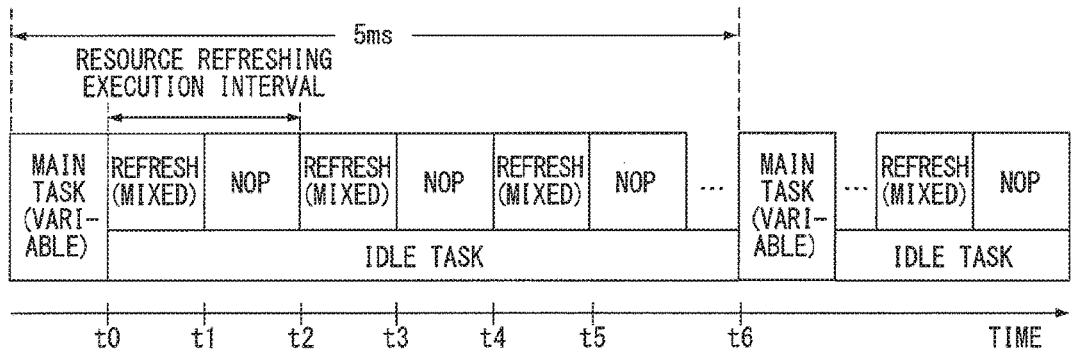
FIG. 3  COMPARISON EXAMPLE
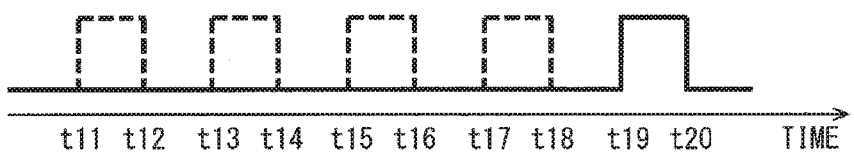

CONTROL UNIT HAVING RADIO INTERFERENCE AVOIDING FUNCTION

CROSS REFERENCE TO RELATED APPLICATION

The present application is based on Japanese patent application No. 2016-236154 filed on Dec. 5, 2016, the whole contents of which are incorporated herein by reference.

FIELD

The present disclosure relates to a control unit having a function of avoiding radio interference.

BACKGROUND

In a conventional system having a wireless LAN and a wired LAN, a radio signal generated from a wired LAN cable when the wired LAN is used for wired communication is likely to interfere with wireless LAN communication (radio communication). JP 2016-29768A proposes to switch over communication channels of the wireless LAN when the wired LAN cable is connected.

In case that the radio signal radiated from a bus, that is, a signal line, whether in the wireless LAN or the wired LAN, it is likely that the radio signal interferes with the wireless communication.

In implementing the technology disclosed in JP 2016-29768A, it is necessary to change the communication channel of the wireless communication so that the wireless communication is not interfered.

SUMMARY

It is therefore an object of the present disclosure to provide a control unit, which suppresses a radio signal generated in wired communication from interfering with wireless communication without switching over communication channels.

According to the present disclosure, a control unit comprises a storage part and a mixed processing execution part. The storage part is rewritable and stores activation interval information indicating an activation interval of mixed processing of transmission processing and non-transmission processing. The transmission processing includes signal transmission through a bus and the non-transmission processing includes no signal transmission through the bus. The mixed processing execution part is configured to determine an execution start time of the mixed processing based on the activation interval information stored in the storage part and executes the mixed processing from a determined execution start time.

BRIEF DESCRIPTION OF THE DRAWINGS

FIG. 1 is a block diagram showing a configuration of a microcontroller;

FIG. 2 is a time chart showing tasks executed by a CPU provided as the microcontroller shown in FIG. 1;

FIG. 3 is a time chart showing bus access processing executed in a comparison example.

EMBODIMENT

Figure 4:
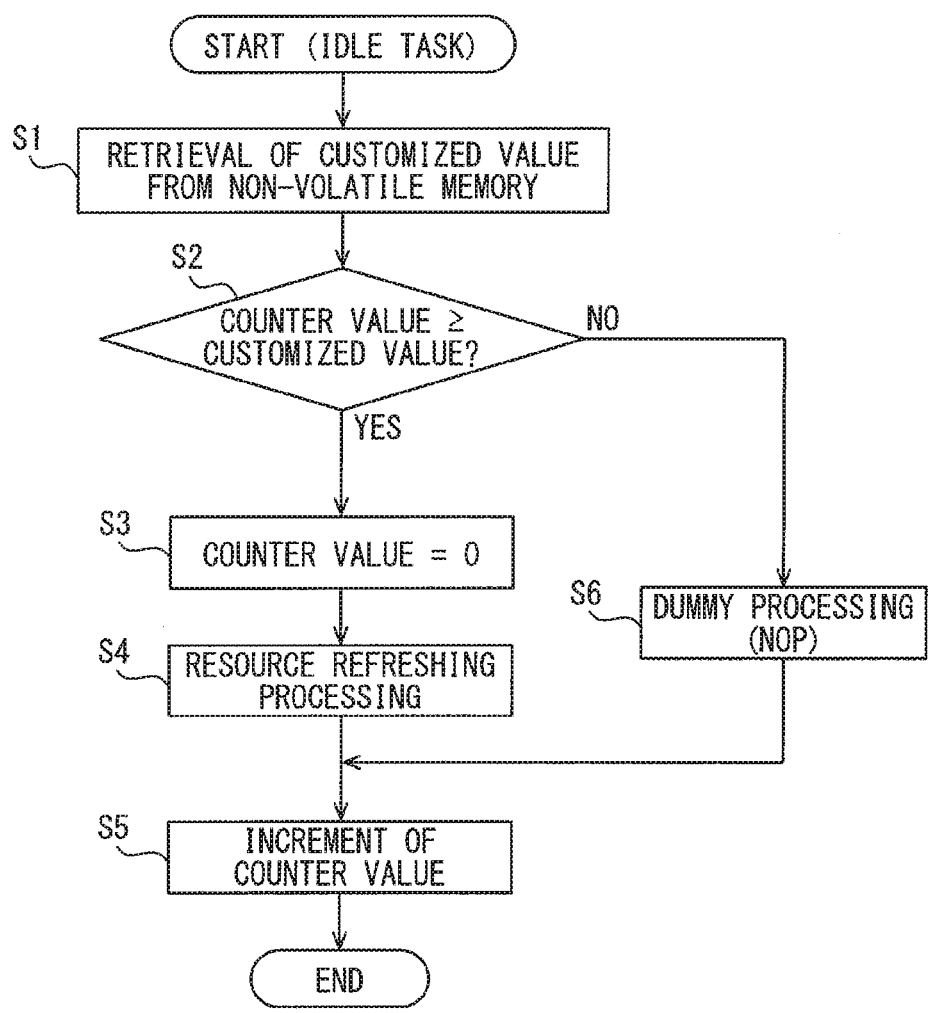
FIG. 4 is a flowchart showing processing executed by the CPU in an idle task period.

An embodiment of a control unit according to the present disclosure will be described below with reference to the accompanying drawings.

[Whole Configuration]

Referring first to FIG. 1, a microcontroller 1 is provided as a control unit. The microcontroller 1 includes a ROM 2, a RAM 3, a non-volatile memory 4, a peripheral circuit 5, a CPU (central processing unit) 6, an internal bus 7 and an antenna 8. The microcontroller 1 is provided as a part of electronic components of an electronic control unit (ECU).

The ROM 2 stores therein programs, which are executed by the CPU 6. The RAM 3 temporarily stores therein data generated when the CPU 6 executes the programs stored in the ROM 2. The non-volatile memory 4 is provided as a storage part, which is capable of rewriting data stored therein. The non-volatile memory 4 may be an EEPROM. The non-volatile memory 4 stores therein a customized value, which matches an activation interval for refreshing resources (hereinafter referred to as resource refreshing processing) to a period, which suppresses interference with wireless communication (radio communication) performed via the antenna 8. That is, the customized value is unique to the control unit 1 and set in consideration of the frequency of the wireless communication performed via the antenna.

The peripheral circuit 5 is, for example, a timer, a watchdog timer, an interrupt controller, an AD conversion circuit and a DA conversion circuit.

The CPU 6 is an arithmetic and logic circuit, which executes the programs stored in the ROM 2 by using a temporary storage function of the RAM 3. The CPU 6 is connected to the ROM 2, the RAM 3, the non-volatile memory 4 and the peripheral circuit 5 through the internal bus 7. The CPU 6 executes various functions by execution of the programs stored in the ROM 2. For example, the CPU 6 executes data transmission and reception with the peripheral circuit 5 and executes the refreshing processing for the peripheral circuit 5 by transmitting a control signal to the peripheral circuit 5. The refreshing processing for the peripheral circuit 5 is, for example, refreshing registers and buffers provided in the peripheral circuit 5.

In the present embodiment, the processing executed by the CPU 6 is divided into a main task and an idle task. The main task is started at a fixed interval. An interval from a completion of the main task to a next start of the main task is an idle task period.

[Task Execution Time Chart]

One example of task execution of the CPU 6 is shown as a time chart in FIG. 2. As shown in FIG. 2, the main task is executed at every interval of 5 ms in the present embodiment. Further, as shown in FIG. 2, the idle task period includes a resource refreshing period and a non-processing period in the present embodiment. The resource refreshing period is a period for executing the resource refreshing processing. Processing other than the resource refreshing processing is executed in the main task. The resource means elements, which are connected to the CPU 6 or provided within the CPU 6. For example, the RAM 3 is an element connected to the CPU 6 and registers are elements provided within the CPU 6. The resource refreshing processing is executed for re-setting initial values of those resources.

Since the resources include the element connected to the CPU 6 and the element provided within the CPU 6, the resource refreshing processing includes bus access processing and bus non-access processing. The bus access processing means processing of signal transmission through the internal bus 7. The bus non-access processing means processing of no signal transmission through the internal bus 7. The processing executed by making bus access is referred to as signal transmission processing. The processing executed by making no bus access is referred to as non-transmission processing. The resource refreshing processing is referred to as mixed processing, which includes both of the bus access processing and the bus non-access processing. Since the CPU 6 executes the resource refreshing processing, which corresponds to the mixed processing, the CPU 6 has a function as a mixed processing execution part.

The antenna 8 operates as one of or both of a receiving antenna, which receives radio signals transmitted from an external location of the microcontroller 1, and a transmitting antenna, which transmits radio signals from the microcontroller 1. The antenna 8 is connected to a radio communication part (not shown). The wireless communication part may be provided inside the microcontroller 1 or outside the microcontroller 1 in the ECU.

As described above, the resource refreshing processing includes the bus access processing, which makes access to the bus, and the bus non-access processing, which makes no access to the bus. Those processing are executed periodically in the period of idle task. By periodic execution of the refreshing processing, even when a set value is changed erroneously to an incorrect value, the set value is returned to a correct value after an elapse of the execution period of the refreshing processing and hence the erroneous operation is rectified.

However, noise is generated from the internal bus 7 each time the bus access is made. For this reason, when the bus access is made periodically, the noise is generated at a frequency determined by the interval of the bus access. If the frequency of noise generated by the bus access is the same as a communication frequency of the antenna 8, the noise is likely to interfere with the wireless communication performed via the antenna 8.

In case that the noise generated as a result of processing, which makes bus access, is expected to interfere with the wireless communication performed via the antenna 8 in a designing stage, it is possible to suppress the adverse effect of the noise on the wireless communication by changing the period of bus access.

Comparison Example

Before changing of the period of making bus access in the present embodiment is described, a comparison example will be described. The resource refreshing processing includes various detailed processing. The detailed processing includes, as described above, both of the processing, which makes bus access, and the processing, which makes no bus access. For changing the period of making the bus access, the resource refreshing processing is divided into the processing, which makes bus access, and the processing, which makes no bus access. In the following description regarding the comparison example, a period for executing the processing, which makes no bus access, is referred to as a first resource refreshing period and a period for executing the processing, which makes the access, is referred to as a second resource refreshing period.

For changing the interval of making the bus access, an interval of the second resource refreshing period may be changed. As a method for changing the interval of the second resource refreshing period without affecting the execution interval of the first resource refreshing period, it is proposed to not execute the processing, which makes bus access, in every periodic second resource refreshing period but to execute it in the following manner. That is, it is proposed to execute the processing, which makes bus access, in only some of the second resource refreshing periods and execute dummy processing, which makes no bus access, in the other of the second resource refreshing periods.

FIG. 3 schematically shows one exemplary case, in which the refreshing processing making the bus access is executed in only one of five periodic second resource refreshing periods and the dummy processing is executed in the remaining four of the five periodic second resource refreshing periods. In the example shown in FIG. 3, the dummy processing is executed four times in four periods, that is, from time t11 to time t12, from time t13 to time t14, from time t15 to time t16 and from time t17 to time t18 as indicated by a dotted line and the refreshing processing, which makes bus access, is executed only in one period from time t19 to time t20 as indicated by a solid line. According to this example, the frequency of noise is reduced to one-fifth in comparison to a case, in which the refreshing processing making the bus access is executed in all periods from time t11 to time t12, from time t13 to time t14, from time t15 to time t16 and from time t17 to time t18.

It is however necessary to divide the resource refreshing processing executed in the idle task period into the processing, which makes bus access, and the processing, which does not make the bus address, for implementing the method of the comparison example described above. Further, it is necessary to change details of the resource refreshing processing in correspondence to changes in the resources provided in the microcontroller 1. For this reason, in case that the method of the comparison example is implemented in a microcontroller having different resources, the resource refreshing processing executed in the idle task period need be divided newly into processing, which makes bus access, and processing, which makes no bus access. That is, the method of the comparison example requires a new design workload at every implementation of such a method.

[Noise Frequency Changing Method in Present Embodiment]

In the present embodiment, as shown in FIG. 2, the resource refreshing period is not divided into two separate periods, which are for the processing, which makes bus access, and the processing, which makes no bus access.

In the present embodiment, as opposed to the comparison example, the resource refreshing processing in not divided into two processing, one of which makes bus access and the other of which makes no bus access. Further, some of the periods for executing the processing, which makes bus access, is not replaced with the dummy processing. In the present embodiment, the frequency of the noise is changed by changing the interval of execution of the resource refreshing processing. With a change in the interval of execution of the resource refreshing processing, the interval of making the bus access in the resource refreshing processing is changed correspondingly. Thus, the noise frequency is changed by changing the interval of execution of the resource refreshing processing.

[Processing in Idle Task Period]

Processing executed by the CPU 6 in the idle task period shown in FIG. 2 is shown in FIG. 4. The processing shown in FIG. 4 is activated to start when the main task is finished, that is, when the task moves to the idle task. Although the execution of the main task is started periodically, that is, repeated at every interval of 5 ms for example, the duration of each execution of the main task is not fixed and the time point of finishing the main task varies with contents, which are actually executed in each task.

At S1 (hereinafter S means step), a customized value (for example, 1) is retrieved from the non-volatile memory 4. At next S2, it is checked whether a counter value equals or exceeds the customized value. The counter value is set to zero (0) when the resource refreshing processing is started and incremented by one (1) at S5 as described later. The counter value is thus increased in proportion to elapse of time after starting of the resource refreshing processing. When a check result at S2 is YES, S3 is executed. When the check result at S2 is NO, S6 is executed.

At S3, the counter value is reset to zero (0). At S4, the resource refreshing processing is executed. The counter value indicates the elapse of time from starting of the resource refreshing processing. Since the resource refreshing processing is started when the counter value reaches or exceeds the customized value, the customized value is a piece of information, which determines the interval of activation of the resource refreshing processing. That is, the customized value is activation interval information. The counter value reaching or exceeding the customized value indicates that it is time to start execution of the resource refreshing processing.

As described above, the resource refreshing processing includes the processing, which makes bus access, and the processing, which makes no bus access. In the present embodiment, the resource refreshing processing is executed without dividing it into those two types of processing.

Detailed content of the resource refreshing processing executed at S4 is, for example, execution of the resource refreshing processing on all resources, which need the resource refreshing processing. Alternatively, the detailed content of the resource refreshing processing executed at S4 may be execution of the resource refreshing on all resources in such a manner that the resource refreshing processing is executed on a predetermined number of the resources in each resource refreshing period in a predetermined sequence. After finishing the resource refreshing processing, S5 is executed. At S5, the counter value is incremented by one (1).

When the check result at S2 is NO, S6 is executed. At S6, dummy processing is executed for a fixed time period. The dummy processing may be processing, which makes no bus access. For example, no-operation (NOP) processing is executed as the dummy processing. After execution of S6, S5 is executed to increment the counter value by one.

This processing (resource refreshing and no operation) shown in FIG. 4 is executed in repetition until the task moves to the main task. When the task moves to the main task, the counter value is maintained without changing.

The processing of the idle task shown in FIG. 4 will be described further in correspondence to the time chart shown in FIG. 2. The processing of FIG. 4 is started to execute S1 and S2 at time t0, at which time the main task is finished and the idle task is started. In the example of FIG. 2, it is assumed that S5 of FIG. 4 is executed last in the previous idle task period and the counter value reached the customized value. Based on this assumption, the check result of S2 executed at time t0 is YES and S3 and S4 are executed. Thus, the resource refreshing processing is executed from time to.

In the example of FIG. 2, the resource refreshing processing of the first time is finished at time t1. At time t1, although the resource refreshing processing is finished, it is not yet the activation time of the main task. For this reason, the dummy processing is executed for the fixed time period. The no-operation (NOP) period means an interval, during which the dummy processing is repeated. When the dummy processing is finished for the fixed period, the counter value is incremented by 1 at S5. Since the dummy processing of S6 is repeated until the counter value reaches the customized value, the no-operation period lasts until the counter value exceeds the customized value.

When the counter value exceeds the customized value, S3 and S4 are executed again. As a result, the resource refreshing period follows. Thus, the resource refreshing processing is started again at time t2 in FIG. 2.

The resource refreshing period starting from time t2 ends at time t3, after which the no-operation period follows again. The counter value exceeds the customized value at time t4 and thereafter the resource refreshing period follows again. The resource refreshing period starting from time t4 ends at time t5, after which the no-operation period follows again. After repetition of the resource refreshing period and the no-operation period, it becomes time to execute the main task. The execution period of the main task from time to ends at time t6. At time t6, the idle task period ends and the main task is started.

Advantage of Embodiment

In the present embodiment described above, the customized value is stored in the non-volatile memory 4 as the information, which determines the interval of activation of the resource refreshing processing. Since the non-volatile memory 4 is rewritable, the microcontroller 1 of the present embodiment is capable of changing the activation interval of the resource refreshing processing.

By changing the activation interval of the resource refreshing processing, the execution interval of the bus access executed in the resource refreshing processing is changed correspondingly. For this reason, it is possible to suppress interference with the wireless communication by changing the activation interval of the resource refreshing processing so that the frequency determined by the activation interval of the resource refreshing processing does not become the frequency of the communication channel of the wireless communication using the antenna 8.

Further, in the present embodiment, the activation interval for avoiding the interference is set by not only the processing, which makes bus access, but also the entire resource refreshing processing including both processing, one of which makes bus access and the other of which makes no bus access. For this reason, it is not necessary to divide the resource refreshing processing into two processing, one of which makes bus access and the other of which makes no bus access. As a result, it is possible to save the workload of dividing the detailed processing included in the resource refreshing processing into the processing, which makes bus access, and the processing, which makes no bus access, at each implementation of the program related to the resource refreshing processing into different products.

Further, in the present embodiment, the customized value, which is the information for determining the activation interval of the resource refreshing processing, is stored in the non-volatile memory 4, which is a rewritable storage part. It is thus only necessary to change the customized value stored in the non-volatile memory 4 in case of adaptation to a microcomputer having a different frequency of wireless communication, with which interference is to be avoided. That, the present embodiment can be applied to the microcontroller having the different wireless communication frequency, at which the interference need be avoided.

The control unit 1 is not limited to the embodiment described above but may be modified as exemplified below. In the following modifications, similar component parts as those in the embodiment described above are designated with the same reference numerals for simplification of the description.

<First Modification>

In the embodiment described above, the resource refreshing processing is exemplified as the mixed processing. However, the mixed processing is not limited to the resource refreshing processing but may be any processing, which includes both processing, one of which makes bus access and the other of which makes no bus access.

For this reason, in case that the main task includes both of the processing, which makes bus access, and the processing, which makes no bus access, the main task may be set as the mixed processing. In case that the main task is set as the mixed processing, the activation interval information, which determines the activation interval of the main task, is stored in the non-volatile memory 4.

<Second Modification>

The bus is not limited to the internal bus 7 but may be an external bus, which connects the microcontroller 1 and external circuits. The processing, which makes bus access, may be limited to processing for transmitting signals to the peripheral circuit 5 through the internal bus 7.

<Third Modification>

The antenna 8 need not be provided to the microcontroller 1 nor the ECU, which includes the microcontroller 1, but may be provided around the microcontroller 1. This is because, in case that the antenna 8 is near the microcontroller 1, the noise generated when the microcontroller 1 makes bus access is likely to interfere with the wireless communication using the antenna 8.

What is claimed is:

1. A control unit comprising:
   a CPU; and
   a memory, which is rewritable, the memory is configured to store activation interval information indicating an activation interval of mixed processing of transmission processing and non-transmission processing, the transmission processing executing a signal transmission through a bus and the non-transmission processing executing no signal transmission through the bus; and
   the CPU is configured to
      determine an execution start time of the mixed processing based on the activation interval information stored in the storage part and
      execute the mixed processing of the transmission processing and the non-transmission processing from the determined execution start time, wherein:
   the non-transmission processing is a refreshing processing for refreshing an element arranged within the CPU; and
   the transmission processing is a refreshing processing for refreshing the peripheral circuit connected to the CPU via the bus.

2. The control unit according to claim 1, wherein the CPU is further configured to:
   periodically execute a main task which is started at a fixed interval; and execute an idle task when the main task completes until a next start of the main task; and
   execute the mixed processing repeatedly in the idle task.

3. The control unit according to claim 1, wherein the non-transmission processing of the mixed processing includes dummy processing for a fixed period.

4. A control unit comprising:
   a CPU;
   a memory, which is rewritable, the memory is configured to store activation interval information indicating an activation interval of mixed processing of transmission processing and non-transmission processing, the transmission processing executing a signal transmission through a bus and the non-transmission processing executing no signal transmission through the bus;
   an internal bus provided as the bus; and
   a peripheral circuit connected to the CPU through the internal bus, wherein
   the CPU is configured to
      determine an execution start time of the mixed processing based on the activation interval information stored in the storage part and
      execute the mixed processing of the transmission processing and the non-transmission processing from the determined execution start time,
   wherein the CPU is further configured to
      execute the mixed processing which is refreshing processing executed for a resource provided in the control unit; and
      execute the transmission processing which includes refreshing processing, which the CPU executes for the peripheral circuit by transmitting a control signal to the peripheral circuit through the internal bus.

* * * * *